(12) United States Patent
Livesay et al.

(10) Patent No.: US 6,195,246 B1
(45) Date of Patent: Feb. 27, 2001

(54) ELECTROSTATIC CHUCK HAVING REPLACEABLE DIELECTRIC COVER

(75) Inventors: William R. Livesay; David M. Rose; Richard Ross, all of San Diego, CA (US)

(73) Assignee: Electron Vision Corporation, San Diego, CA (US)

(*) Notice: Subject to any disclaimer, the term of this patent is extended or adjusted under 35 U.S.C. 154(b) by 0 days.

(21) Appl. No.: 09/281,399

(22) Filed: Mar. 30, 1999

(51) Int. Cl.$^7$ .................................................. H02N 13/00
(52) U.S. Cl. ............................................................. 361/234
(58) Field of Search ............................... 361/234; 279/128

(56) References Cited

U.S. PATENT DOCUMENTS

| | | | |
|---|---|---|---|
| 3,983,401 | 9/1976 | Livesay | 250/492 |
| 5,103,367 | 4/1992 | Horwitz et al. | 361/234 |
| 5,325,261 | 6/1994 | Horwitz | 361/34 |
| 5,644,467 | * 7/1997 | Steger et al. | 361/234 |
| 5,822,171 | * 10/1998 | Shamouilian et al. | 361/234 |
| 5,905,626 | * 5/1999 | Logan et al. | 361/234 |

OTHER PUBLICATIONS

Wardly, George A; "Electrostatic Wafer Chuck for Electron Beam Microfabrication"; Rev. Sci. Instrum, vol. 44, No. 10, Oct. 1993, pp. 1506–1509.

Singer, Peter; "Electrostatic Chucks in Wafer Processing"; Semiconductor International; Apr. 1995, pp. 57–64.

* cited by examiner

*Primary Examiner*—Michael J. Sherry
(74) *Attorney, Agent, or Firm*—Roberts & Mercanti, LLP

(57) ABSTRACT

An electrostatic holding device for holding semiconductor wafers and similar materials during microelectronic device manufacturing operations. It has a circular, electrically conductive wafer support having a rounded periphery; an annular border region; and a flat, concentric, raised, central plateau having an electrically conductive top surface. The plateau has a tapered circumferential edge which extends down to the annular border region. A nonelectrically conductive coating is on the rounded periphery, the border region and the tapered edge which extends to, but does not cover, the conductive top surface of the central plateau such that an the coating is coplanar with the conductive top surface of the central plateau. A removable dielectric sheet overlies the top surface of the central plateau, the coating on the tapered edge and the coating on the border region. The dielectric sheet is releasably attached to the top surface of the central plateau, the coating on the tapered edge and the coating on the border region such that the release is by the application of peeling forces. A uniform electric field across the dielectric layer holds a wafer on the support via the dielectric sheet.

28 Claims, 3 Drawing Sheets

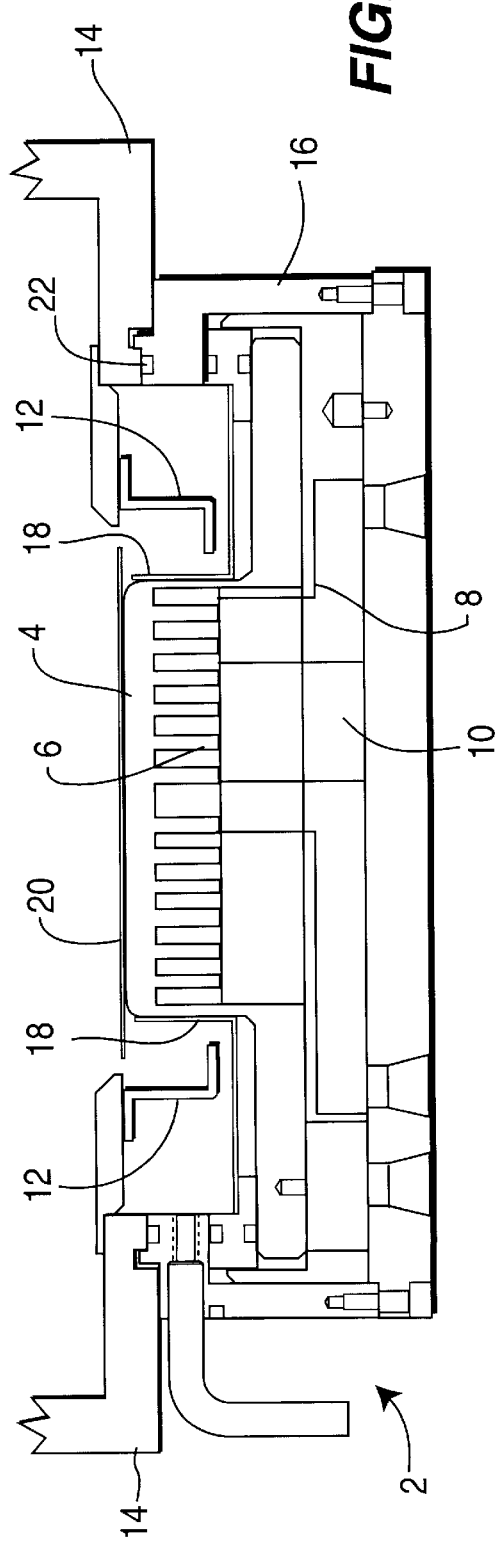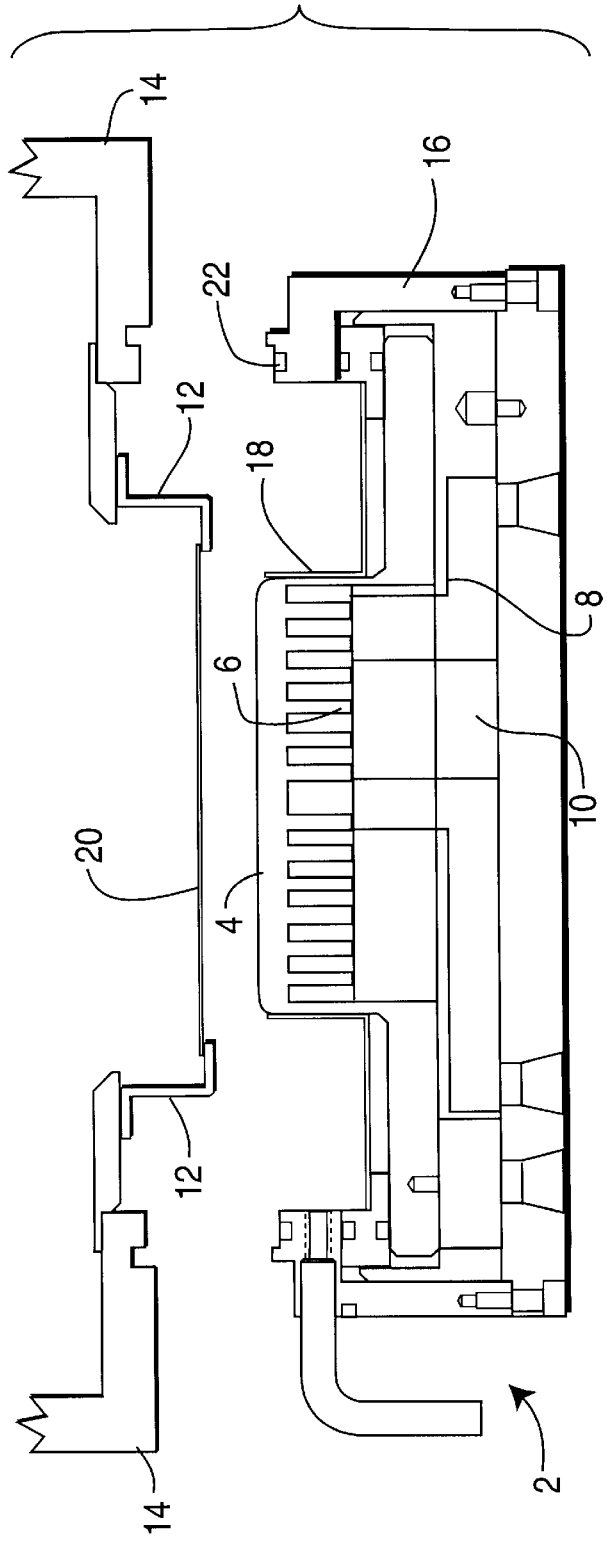

ELECTROSTATIC CHUCK HAVING REPLACEABLE DIELECTRIC COVER

BACKGROUND OF THE INVENTION

1. Field of the Invention

The present invention relates to electrostatic holding devices and more particularly to devices for holding semiconductor wafers and similar materials during microelectronic device manufacturing operations such as electron beam exposure, etching, polishing, sputtering, annealing, vapor deposition and the like.

2. Description of the Related Art

The processing of semiconductor wafers into useful microelectronic devices requires a level, horizontal clamping of the wafers inside various processing machines, Wafers themselves, or patterns on an upper surface of such wafers can be easily damaged by chipping which result in dirt particles adhering onto the patterned surface or wafer breakage. Many wafer clamping methods are known such as those which use mechanical clamps or electrostatic forces to attach the wafer to a support. An example of a mechanical clamp is shown in the U.S. Pat. No 4,603,466 where an outer ring presses down on the front face of a wafer, while a domed back surface is pressurized.

However, wafer stress and possible damage to the wafer surface result from such an arrangement. Electrostatic methods of holding semiconductor wafers are preferred due to the ability of electrostatic clamps to operate without contacting the delicate front surface of patterned semiconductor wafers. One electrostatic chuck is described in U.S. Pat. No. 4,412,133 wherein electrostatic forces are used in addition to that of an outer mechanical clamping ring. A method of enhanced electrostatic attraction is described in U.S. Pat. No. 4,554,611 by utilizing charge retention, mechanically jiggling the wafer and then disconnecting the applied voltage. Other electrostatic chucks are exemplified by U.S. Pat. Nos. 3,983,401; 5,325,261 and 5,103,367.

Electrostatic chucks typically comprises a flat platform through which a relatively large static electric field is transmitted. The platform supports a wafer which has been placed thereon, and a thereafter applied electrostatic field firmly holds the wafer in place and prevents its movement during treatment processes. When the desired treatment processes are completed, the electric field is reduced and the wafer removed from the platform surface.

One problem with known electrostatic chucks is that the platform tends to become damaged after being subjected to microelectronic device manufacturing operations such as electron beam exposure, etching, polishing, sputtering, annealing and vapor deposition. This damage has usually necessitated a complete replacement of the platform. An improved platform which is known in the art employed a support having a raised central plateau. The edge of the platform was coated with a dielectric paint and the plateau applied with a replaceable dielectric sheet. Thus if the sheet becomes damaged, only the sheet is replaced rather than the entire platform. A problem with this arrangement is that an sharp edge is formed between the raised central plateau and the region surrounding the plateau. A much higher localized electric field is produced at this edge which causes arcing and breaking through the dielectric sheet. The present invention solves this arcing problem by providing a central plateau which does not have a sharp edge, but rather has an edge which tapers down to the region surrounding the plateau. A dielectric coating or paint is then applied on the taper and surrounding region such that the top level of the coating is level with the top of the plateau without covering the central part of the plateau. The dielectric sheet is then removably attached, for example by an adhesive, to the central part of the plateau, and to the coating on the taper and surrounding region. The platform is thus both protected by the dielectric sheet and arcing is prevented.

SUMMARY OF THE INVENTION

The invention provides an electrostatic chuck for holding a wafer during microelectronic device processing comprising a) a circular, electrically conductive wafer support having a rounded periphery; an annular border region; and a flat, concentric, raised, central plateau having an electrically conductive top surface; the plateau having a tapered edge which extends down to the annular border region;

b) a nonelectrically conductive coating on the rounded periphery, the border region and the tapered edge which extends to, but does not cover, the conductive top surface of the central plateau such that an upper level of the coating on the border region is coplanar with the conductive top surface of the central plateau;

c) a removable dielectric sheet overlying the top surface of the central plateau, the coating on the tapered edge and the coating on the border region;

d) means for attaching the dielectric sheet to the top surface of the central plateau, the coating on the tapered edge and the coating on the border region and for releasing the dielectric sheet from the top surface of the central plateau, the coating on the tapered edge and the coating on the border region by the application of peeling forces; and e) means for applying a substantially uniform electric field across said dielectric layer for holding a wafer on the support via the dielectric sheet.

The invention also provides a process for producing a microelectronic device comprising I) positioning a wafer on the above electrostatic chuck, and II) holding the wafer on the support via the dielectric sheet by applying a substantially uniform electric field through the top surface of the central plateau and through said dielectric layer.

BRIEF DESCRIPTION OF THE DRAWINGS

FIG. 3 shows an electrostatic chuck with the platform in the raised position holding a semiconductor wafer.

FIG. 4 shows an electrostatic chuck with the platform in the lowered position after releasing a semiconductor wafer.

DETAILED DESCRIPTION OF THE PREFERRED EMBODIMENT

Figure 1:
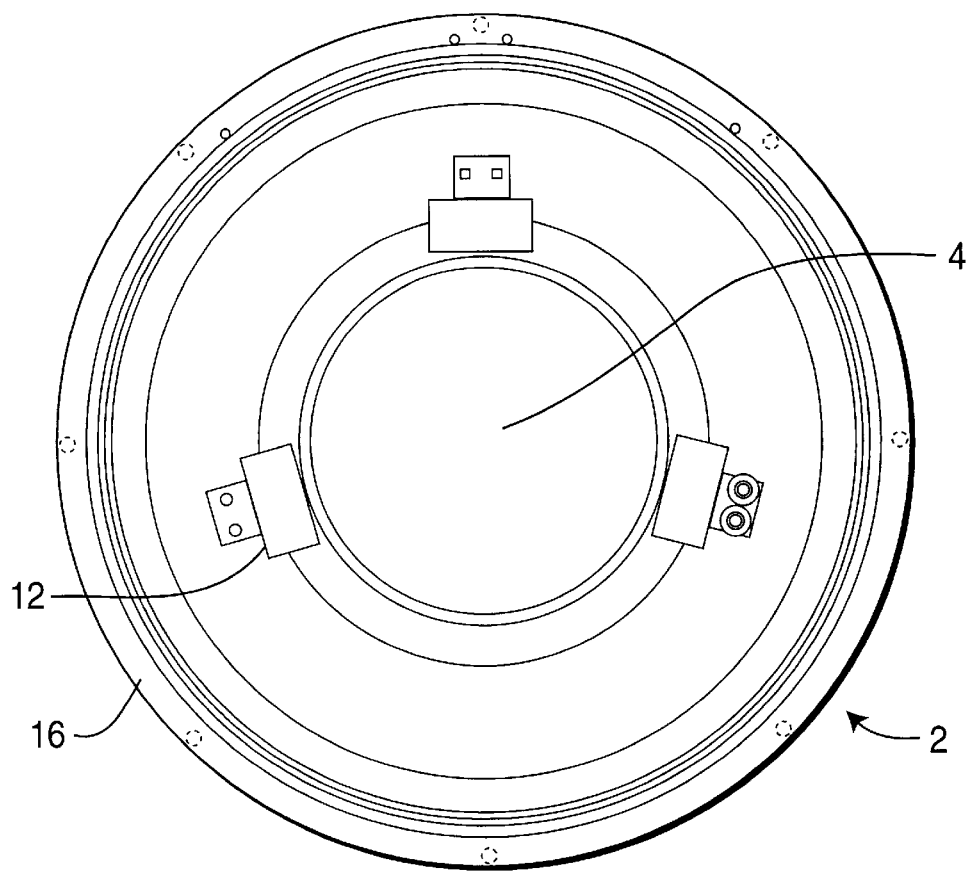
FIG. 1 shows a plan view of an electrostatic chuck according to the invention.
Figure 2:
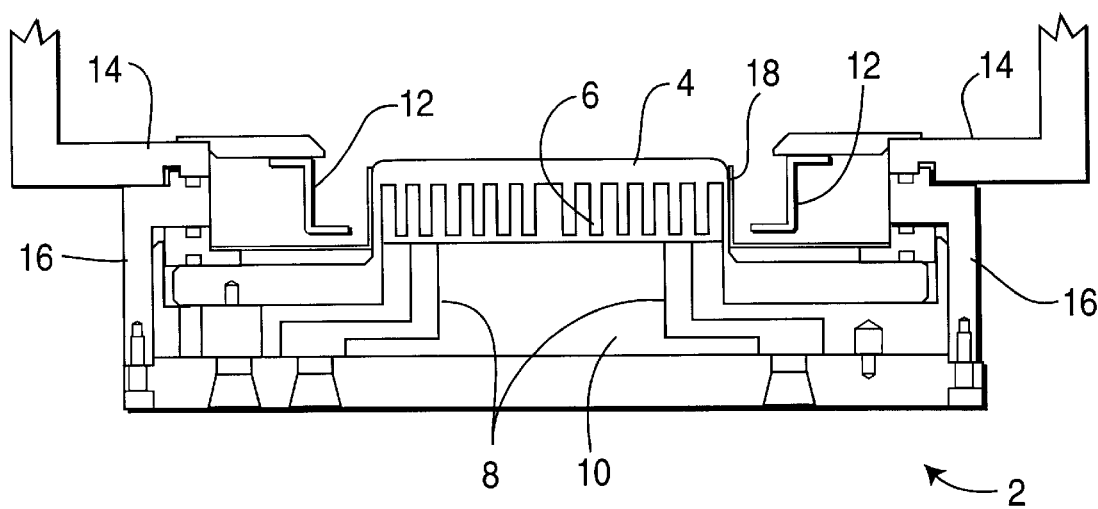
FIG. 2 shows a side, partial cross sectional view of an electrostatic chuck according to the invention.

FIGS. 1 and 2 show top and side views of an electrostatic chuck arrangement 2 according to the invention. The chuck has an electrostatic platform 4, preferably having heat dissipating fins 6 for transferring heat from the support, and high voltage connections 8. Platform 4 is preferably seated on an insulating and cooling media 10 which may cooled such as by air or water cooling. The chuck further comprises a plurality of substrate supports 12 which are used for placing the wafer on the platform 4. The chuck may also be provided with a platform shield 18 which protects the sides of the platform during such device manufacturing operations. The chuck arrangement 2 is preferably disposed in a tool, such as a cluster tool which maintains vacuum conditions during microelectronic device manufacturing operations. As such the chuck arrangement may function as a sealing door for the tool by both a fixed vacuum housing 14 and a movable vacuum housing 16. FIGS. 3 and 4 show the chuck arrangement when the tool door it is in the closed and open positions respectively. As may be seen in FIG. 4, after a wafer 20 has been delivered by suitable means, such as a cluster tool robot, it is loosely seated on supports 12 and the platform is in a lowered position. The wafer may comprises a semiconductor material. Such as gallium arsenide, germanium, silicon, silicon germanium, lithium niobate, compositions containing silicon and mixtures thereof FIG. 3 shows the platform in a raised position wherein the wafer 20 has been seated on the platform 4. In the closed position as shown in FIG. 3, the fixed vacuum housing 14 and movable vacuum housing 16 join together and are sealed by a suitable o-ring 22.

Figure 5:
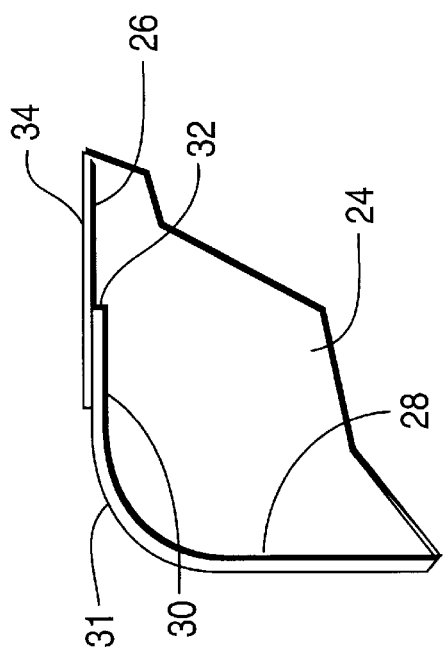
FIG. 5 shows a side of a prior art electrostatic chuck platform.

FIG. 5 shows a partial sectional view of a prior art chuck platform. It has a metal, electrically conductive body 24 suitable for forming a high electrostatic field. The body has a rounded periphery 28; an annular border region 30; and a flat, concentric, raised, central plateau 26 having an electrically conductive top surface and a sharp edge corner 32. The rounded periphery 28 and border region 30 are covered with an insulating coating 31 up to the sharp edge corner 32. In this prior art arrangement, the central plateau 26, sharp edge corner 32 and border region 30 are covered with an electrically insulating replaceable sheet 34. The sharp edge corner develops a localized high electric field zone which causes arcing and breaks through and damages the sheet 34.

Figure 8:
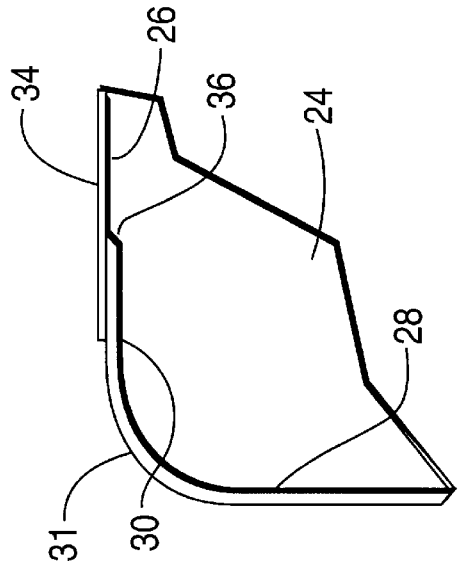
FIG. 8 shows a side cutaway view of part of an electrostatic chuck platform having a raised plateau with a tapered edge which are applied with an insulating coating and further applied with a removable dielectric sheet.
Figure 7:
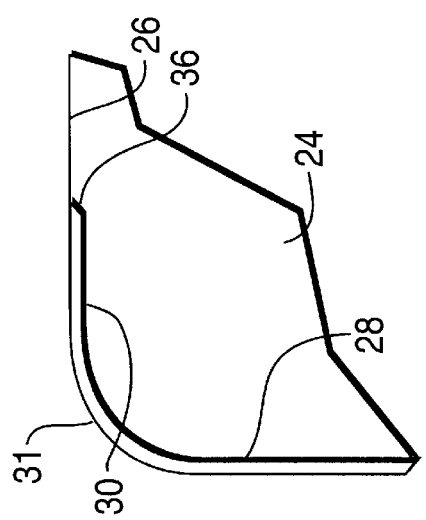
FIG. 7 shows a side cutaway view of part of an electrostatic chuck platform having a raised plateau with a tapered edge which are applied with an insulating coating.
Figure 6:
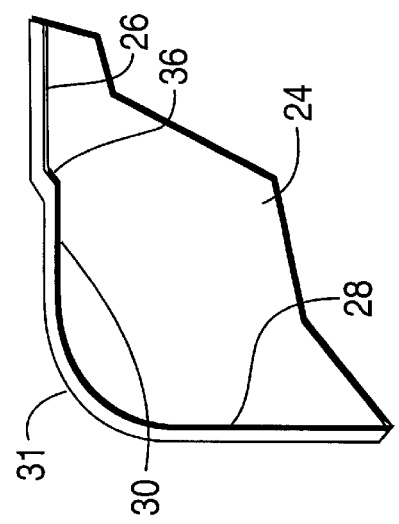
FIG. 6 shows a side cutaway view of part of an electrostatic chuck platform having a raised plateau with a tapered edge.

FIGS. 6 through 8 show an improvement according to the invention which avoids this arcing and damage. The inventive chuck platform again has a metal, electrically conductive body 24 suitable for forming a high electrostatic field. The body has a rounded periphery 28; an annular border region 30; and a flat, concentric, raised, central plateau 26 having an electrically conductive top surface. However, the annual border central plateau 26 has an edge 36 which tapers down to the annular border region 30. The rounded periphery 28, annular border region 30, and tapered edge 36 are covered with an insulating coating 31. This may be done by coating the rounded periphery 28, annular border region 30, tapered edge 36 and raised plateau 26 with the insulating coating as shown in FIG. 6 and then polishing back the coating such that the conductive top surface of the central plateau 26 and an upper level of the coating on the border region 30 is coplanar with the conductive as shown in FIG. 7. The thusly prepared platform is then covered with a removable dielectric sheet 34. The tapered edge 36 prevents a localized high electric field zone and hence arcing and damage to sheet 34.

In the processing of a microelectronic device, a transferring device such as a robot from a cluster tool positions a wafer on the supports 12. Thereafter the platform raises and lifts the wafer from the support. A high voltage, substantially uniform electrostatic field is applied to the platform via suitable lines 8. An electric field of from about 25,000 volts/mm to about 80,000 volts/mm serves to hold the wafer on the top surface of the central plateau through the dielectric sheet. In the preferred embodiment, the coating material may be an insulating coating such as Scotchcast 5555 or 5230 from 3M. In the preferred embodiment, the dielectric sheet 34 comprises a polyimide which has a high dielectric strength. A suitable material is Kapton, which is commercially available from DuPont and has a dielectric strength of from about 200,000 volts per mm thickness to about 280,000 volts per mm thickness. Dielectric sheet may have a thickness of from about 0.007 mm to about 0.075 mm, preferably from about 0.025 mm to about 0.075. It is important that the dielectric sheet be replaceable in the event of damage such as by the application of peeling forces, usually by peeling with the fingers. Preferably the dielectric sheet is attached to the platform by an adhesive such as a pressure sensitive adhesive. The adhesive may be applied to the entire back side of the dielectric sheet or it may be placed only at the center or the edge of the sheet. The wafer support may be slightly depressed to compensate for the thickness of the adhesive so that the dielectric sheet is essentially perfectly flat. It is advantageous to use as little adhesive as possible so that a suitable electrostatic field can be established with as low a voltage as possible.

Any of a variety of microelectronic device treatment processes may be conducted while the wafer is being held on the electrostatic chuck. Such treatment processes include electron beam irradiation, coating, heating, cooling, plasma etching, ion implantation, ultraviolet radiation exposure, chemical mechanical polishing, sputtering, annealing, vapor deposition, chemical vapor deposition, plasma enhanced chemical vapor deposition and physical vapor deposition. Often such processes are conducted while the wafer is being held under vacuum conditions.

The chuck is especially useful for electron beam radiation exposing with a uniform, large-area, overall electron beam exposure source. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,001,178, the disclosure of which is incorporated herein by reference. Preferably the electron beam radiation exposure is conducted while heating the semiconductor wafer. The temperature during electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 $\mu C/cm^2$ and more preferably from about 50 to about 20,000 $\mu C/cm^2$.

The gas ambient in the electron beam tool can be any of the following gases: nitrogen, oxygen, hydrogen, argon, a blend of hydrogen and nitrogen, ammonia, xenon, helium, or any combination of these gases. The electron beam current is from about 1 to about 150 mA, preferably from about 1 to about 40 mA, and more preferably from about 5 to about 20 mA. Preferably the electron beam radiation exposure is conducted while the wafer is under a vacuum maintained in the range of from about $10^{-5}$ to about $10^2$ torr. Preferably, the electron beam exposing step is conducted with a wide, large beam of electron beam radiation from a uniform large-are electron beam source which covers an area of from about 4 inches to about 256 square inches.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. An electrostatic chuck for holding a wafer during microelectronic device processing comprising
   a) a circular, electrically conductive wafer support having a rounded periphery; an annular border region; and a flat, concentric, raised, central plateau having an electrically conductive top surface; the plateau having a tapered circumferential edge which extends down to the annular border region;
   b) a nonelectrically conductive coating on the rounded periphery, the border region and the tapered edge which extends to, but does not cover, the conductive top surface of the central plateau such that an upper level of the coating on the border region is coplanar with the conductive top surface of the central plateau;
   c) a removable dielectric sheet overlying the top surface of the central plateau, the coating on the tapered edge and the coating on the border region;
   d) means for attaching the dielectric sheet to the top surface of the central plateau, the coating on the tapered edge and the coating on the border region and for releasing the dielectric sheet from the top surface of the central plateau, the coating on the tapered edge and the coating on the border region by the application of peeling forces; and
   e) means for applying a substantially uniform electric field across said dielectric layer for holding a wafer on the support via the dielectric sheet.

2. The electrostatic chuck of claim 1 wherein the means for attaching comprises an adhesive.

3. The electrostatic chuck of claim 1 wherein the means for attaching comprises a pressure sensitive adhesive.

4. The electrostatic chuck of claim 1 wherein the dielectric material has a dielectric strength of from about 200,000 volts per mm thickness to about 280,000 volts per mm thickness.

5. The electrostatic chuck of claim 1 wherein the dielectric material has a thickness of from about 0.007 mm to about 0.075 mm.

6. The electrostatic chuck of claim 1 wherein the dielectric material comprises a polyimide.

7. The electrostatic chuck of claim 1 further comprising means for cooling the support.

8. The electrostatic chuck of claim 1 further comprising air cooling means for cooling the support.

9. The electrostatic chuck of claim 1 further comprising water cooling means for cooling the support.

10. The electrostatic chuck of claim 1 further comprising a shield around lateral sides of the support.

11. The electrostatic chuck of claim 1 further comprising means for transferring heat from the support.

12. A process for producing a microelectronic device comprising
   I) positioning a wafer on an electrostatic chuck, which electrostatic chuck comprises:
      a) a circular, electrically conductive wafer support having a rounded periphery; an annular border region; and a flat, concentric, raised, central plateau having an electrically conductive top surface; the plateau having a tapered circumferential edge which extends down to the annular border region;
      b) a nonelectrically conductive coating on the rounded periphery, the border region and the tapered edge which extends to, but does not cover, the conductive top surface of the central plateau such that an upper level of the coating on the border region is coplanar with the conductive top surface of the central plateau;
      c) a removable dielectric sheet overlying the top surface of the central plateau, the coating on the tapered edge and the coating on the border region;
      d) means for attaching the dielectric sheet to the top surface of the central plateau, the coating on the tapered edge and the coating on the border region and for releasing the dielectric sheet from the top surface of the central plateau, the coating on the tapered edge and the coating on the border region by the application of peeling forces; and
      e) means for applying a substantially uniform electric field across said dielectric layer for holding a wafer on the support via the dielectric sheet; and
   II) holding the wafer on the support via the dielectric sheet by applying a substantially uniform electric field through the top surface of the central plateau and through said dielectric layer.

13. The process of claim 12 further comprising conducting one or more treatment processes to the wafer while the wafer is being held on the electrostatic chuck.

14. The process of claim 12 further comprising conducting one or more treatment processes to the wafer while the wafer is being held on the electrostatic chuck, which treatment processes are selected from the group consisting of electron beam radiation, coating, heating, cooling, plasma etching, ion implantation, ultraviolet radiation exposure, chemical mechanical polishing, sputtering, annealing, vapor deposition, chemical vapor deposition, plasma enhanced chemical vapor deposition and physical vapor deposition.

15. The process of claim 14 wherein one or more of said more treatment processes are conducted while the wafer is being held under vacuum conditions.

16. The process of claim 12 further comprising irradiating the wafer with electron beam radiation while the wafer is being held on the electrostatic chuck.

17. The process of claim 12 further comprising conducting an electron beam radiation treatment process to the wafer while the wafer is being held on the electrostatic chuck, and further conducting one or more additional treatment processes while the wafer is being held on the electrostatic chuck, which additional treatment processes are selected from the group consisting of coating, heating, cooling, plasma etching, ion implantation, ultraviolet radiation exposure, chemical mechanical polishing, sputtering, annealing, vapor deposition, chemical vapor deposition, plasma enhanced chemical vapor deposition and physical vapor deposition.

18. The process of claim 12 wherein the wafer comprises a semiconductor material.

19. The process of claim 12 wherein the wafer comprises a semiconductor material selected from the group consisting of gallium arsenide, germanium, silicon, silicon germanium, lithium niobate, compositions containing silicon and mixtures thereof.

20. The process of claim 16 wherein the electron beam radiation exposing is conducted with a uniform, large-area, overall electron beam exposure source.

21. The process of claim 16 wherein the electron beam radiation exposing is conducted with a uniform large-area electron beam source which covers an exposure area of from about 4 square inches to about 256 square inches.

22. The process of claim 16 wherein the electron beam exposure source generates an electron beam energy level ranging from about 0.5 to about 30 KeV.

23. The process of claim 16 wherein the electron beam radiation exposure source generates an electron dose ranging from about 1 to about 50,000 $\mu C/cm^2$.

24. The process of claim 16 wherein the electron beam exposure source generates an electron beam current of from about 1 to about 150 mA.

25. The process of claim 16 wherein the electron beam radiation exposure is conducted while heating the semiconductor wafer.

26. The process of claim 16 wherein the electron beam radiation exposure is conducted in a gas selected from the group consisting of nitrogen, oxygen, hydrogen, argon, xenon, helium, ammonia, silane, a blend of hydrogen and nitrogen, ammonia and mixtures thereof.

27. The process of claim 16 wherein the electron beam radiation exposure is conducted while heating the wafer at a temperature in the range of from about 20° C. to about 450° C.

28. The process of claim 16 wherein the electron beam radiation exposure is conducted while the wafer is under a vacuum maintained in the range of from about $10^{-5}$ to about $10^2$ torr.

* * * * *